(12) United States Patent
Yeldener et al.

(10) Patent No.: US 9,537,460 B2
(45) Date of Patent: Jan. 3, 2017

(54) APPARATUS AND METHOD FOR AUTOMATIC GAIN CONTROL

(75) Inventors: Suat Yeldener, Whitestone, NY (US); David Barron, Scottsdale, AZ (US); Andrew Kirby, Palatine, IL (US)

(73) Assignee: Continental Automotive Systems, Inc., Auburn Hills, IL (US)

( * ) Notice: Subject to any disclaimer, the term of this patent is extended or adjusted under 35 U.S.C. 154(b) by 781 days.

(21) Appl. No.: 13/189,191

(22) Filed: Jul. 22, 2011

(65) Prior Publication Data
US 2013/0024193 A1    Jan. 24, 2013

(51) Int. Cl.
G10L 19/14 (2006.01)
H03G 3/30 (2006.01)
H04M 1/60 (2006.01)

(52) U.S. Cl.
CPC .......... H03G 3/3089 (2013.01); H03G 3/3005 (2013.01); H04M 1/6008 (2013.01)

(58) Field of Classification Search
CPC .... G10L 19/083; G10L 21/00; G10L 21/0208; G10L 25/78
USPC ........................................................ 704/225
See application file for complete search history.

(56) References Cited

U.S. PATENT DOCUMENTS

| | | | |
|---|---|---|---|
| 4,057,690 A * | 11/1977 | Vagliani et al. | 704/233 |
| 5,301,364 A * | 4/1994 | Arens et al. | 455/69 |
| 5,396,576 A * | 3/1995 | Miki et al. | 704/222 |
| 6,212,273 B1 | 4/2001 | Hemkumar et al. | |
| 6,420,986 B1 * | 7/2002 | Shahaf | H03M 1/183 341/139 |
| 7,155,385 B2 * | 12/2006 | Berestesky et al. | 704/215 |
| 2004/0076271 A1 * | 4/2004 | Koistinen | G10L 19/005 379/88.11 |
| 2005/0071155 A1 * | 3/2005 | Etter | 704/225 |
| 2009/0010453 A1 * | 1/2009 | Zurek et al. | 381/94.5 |
| 2009/0187065 A1 * | 7/2009 | Basinger | 600/25 |
| 2010/0150374 A1 * | 6/2010 | Bryson et al. | 381/86 |
| 2010/0208908 A1 * | 8/2010 | Hoshuyama | H04M 9/082 381/66 |

(Continued)

FOREIGN PATENT DOCUMENTS

| | | | | |
|---|---|---|---|---|
| EP | 2048659 A1 * | 4/2009 | | G10L 21/02 |
| JP | 2006350246 A | * 12/2006 | | |
| WO | 02/097977 A2 | 12/2002 | | |

OTHER PUBLICATIONS

Archibald "Software Implementation of Automatic Gain Controller for Speech Signal," 2008, SPRAAL1 Texas Instrument, pp. 1-15.*

(Continued)

*Primary Examiner* — David Hudspeth
*Assistant Examiner* — Oluwadamilola M Ogunbiyi

(57) ABSTRACT

A speech signal is received at an input. At least one electrical value associated with the received speech signal is tracked. A dynamic adjustment of the speech signal is determined. The dynamic adjustment is selected at least in part so as to minimize a distortion and minimize an over-amplification of the speech signal based at least in part upon an analysis of the at least one electrical value. The dynamic adjustment is further selected to obtain a desired output signal characteristic for the speech signal presented at an output. The dynamic adjustment value is applied to the speech signal and the adjusted speech signal is presented at the output. The gain of the signal can also be limited to prevent over-amplification.

12 Claims, 4 Drawing Sheets

(56) References Cited

U.S. PATENT DOCUMENTS

2010/0278353 A1* 11/2010 Taenzer ............... H04R 1/1083
381/73.1
2011/0131044 A1* 6/2011 Fukuda .................. G10L 15/20
704/246

OTHER PUBLICATIONS

Kuphaldt "Lessons in Electric Circuits, vol. III—Semiconductors," Fifth Edition, Mar. 29, 2009, http://www.allaboutcircuits.com/pdf/SEMI.pdf, http://www.allaboutcircuits.com/vol_3/chpt_1/4.html.*
International Search Report and Written Opinion dated Aug. 24, 2012, from corresponding International Patent Application No. PCT/US2012/041024.

* cited by examiner

US 9,537,460 B2

APPARATUS AND METHOD FOR AUTOMATIC GAIN CONTROL

FIELD OF THE INVENTION

The invention relates generally to providing voice signals to users, and, more specifically to providing automatic gain control for these signals.

BACKGROUND OF THE INVENTION

Automatic gain control (AGC) systems are generally designed to provide a normalized speech level at the output of the system by applying a gain to voice signals received at an input. It is typically desirable that this gain is made as a function of time and that this gain is varied very slowly from one frame to another. However, if the gain that will be applied to speech signal is high, then it will take very long time for AGC to settle to the normalized desired speech level. Unfortunately, many previous AGC algorithms suffered in effectiveness by providing normalized speech very quickly without considering the level of speech signal at the input.

Another problem with previous AGC systems involves noisy environments such as automobile applications. In these applications, where background noise is often high, communications sometimes become impossible when AGC algorithms amplify noise signals more than speech signals. This is a considerable problem in vehicle-to-vehicle communications, which results in an increased noise loop back problem from one vehicle to another, often making effective communications difficult or impossible to achieve.

Still another problem associated with previous AGC approaches is the tendency to over or under amplify the input signal under certain conditions, creating a non-desirable output. More specifically and when normalizing audio signals, unintentional over-amplification can produce a noticeably unpleasant (e.g., noisy) output. When used in vehicle-based hands-free applications where an AGC algorithm is intended to normalize speech, over amplified signals can be unintentionally produced by noise and other sounds common to the environment in the input signal that are misrecognised as speech.

The problems described above result in the limited use of AGC algorithms in automobile and other noisy applications. And when used, user dissatisfaction with these approaches has been high.

BRIEF DESCRIPTION OF THE DRAWINGS

The present invention is illustrated, by way of example and not limitation, in the accompanying figures, in which like reference numerals indicate similar elements, and in which.

Figure 1:
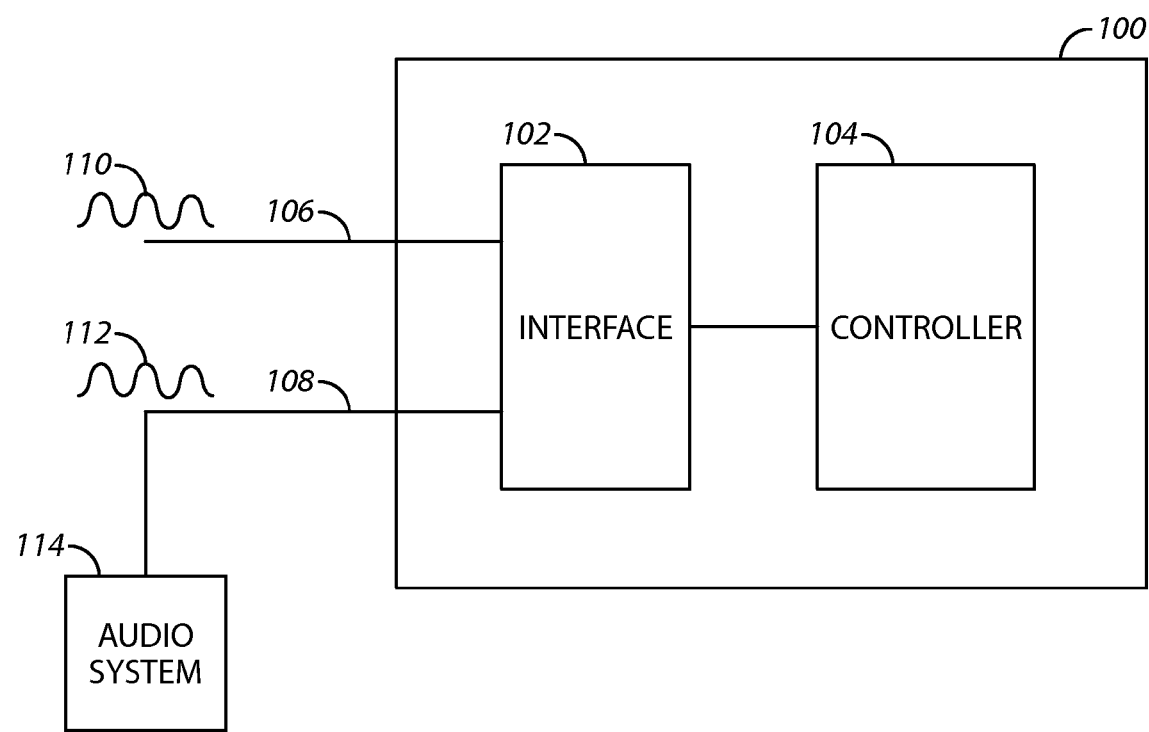
FIG. 1 comprises a block diagram of an apparatus that provides automatic gain control according to various embodiments of the present invention.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION OF THE PREFERRED EMBODIMENTS

In the approaches described herein, noise-adaptive Automatic Gain Control (AGC) algorithms that are particularly applicable and effective in noisy environments (e.g., vehicular applications) are provided. Some of these approaches normalize the level speech signals instantaneously without adding any or substantially any distortion.

In noisy environments, AGC approaches tend to increase the noise power level much more than speech signals which is not desired. Consequently, many of the present approaches employ a robust noise adaptive mechanism that controls the amplification of noise and, as a result, the noise power level is not increased more than the speech power level.

The approaches described herein are also applicable to a wide range of applications such as hands-free communications in vehicles. Many of these approaches are based upon calculations involving the background noise estimate, slow and fast envelope tracking of speech signals, speech pause detection, and speech peak power estimate, among other factors.

Many of these approaches prevent over-amplification by an Automatic Gain Control (AGC) algorithm by pre-determining the maximum allowed amplitude of the output signal. If an absolute limit can be established for the output signal, over-amplification can be limited or eliminated, thereby reducing its negative impact on the system.

In many of these embodiments, a speech signal is received at an input. At least one electrical value associated with the received speech signal is tracked. A dynamic adjustment of the speech signal is determined. The dynamic adjustment is selected at least in part so as to minimize a distortion and minimize an over-amplification of the speech signal based at least in part upon an analysis of the at least one electrical value. The dynamic adjustment is further selected to obtain a desired output signal characteristic for the speech signal presented at an output. The dynamic adjustment value is applied to the speech signal and the adjusted speech signal is presented at the output.

In some aspects, a power level is measured that is associated with an electrical envelope. In other aspects, a speech pause associated with an electrical envelope is detected.

The tracking may include tracking at least one difference between a power level associated with the speech signal and a desired power level. In this case and to take one example, the dynamic adjustment is effective to maintain the signal at the output at substantially the desired power level. Other tracking approaches may also be used.

The analysis may include a variety of different calculations. In one aspect, the analysis includes a computation of a maximum gain based upon a desired output divided by the input and applying the dynamic adjustment value includes limiting the gain of the adjusted speech signal at the output to substantially the maximum computed gain.

In other aspects, the speech signal is transmitted to an audio application in a vehicle. The audio application may be a speaker associated with any application such as hands-free applications in vehicles.

In others of these embodiments, a speech signal is received. Based upon at least one characteristic of the speech signal and at least one characteristic of the desired output signal, a maximum gain so as to limit over amplification of the received speech signal is determined. The determined maximum gain is applied to the signal so as to limit over-amplification of the input signal.

In some aspects, the maximum gain is the gain that would be effective to saturate the speech signal. In other aspects, the maximum gain is the maximum desired output divided by a maximum magnitude of the received speech signal.

In still others of these embodiments, an apparatus configured to control automatic gain control for speech signals includes an interface and a controller. The interface includes an input and an output and the input is configured to receive a speech signal.

The controller is coupled to the interface and configured to track at least one electrical value associated with the received speech signal. The controller is further configured to determine a dynamic adjustment of the speech signal and the dynamic adjustment is selected at least in part so as to minimize a distortion and minimize an over-amplification of the speech signal based at least in part upon an analysis by the controller of the at least one electrical value. The dynamic adjustment is further selected to obtain a desired output signal characteristic for the speech signal to be presented at the output. The controller is configured to apply the dynamic adjustment value to the speech signal and present the adjusted speech signal at the output of the interface.

In some aspects, the controller is configured to track a power level measured associated with an electrical envelope. In other aspects, the controller is configured to detect a speech pause associated with an electrical envelope. In yet other aspects, the controller is configured to track at least one difference between a power level associated with the speech signal and a desired power level, and the dynamic adjustment is effective to maintain the signal at the output at substantially the desired power level.

In some examples, the analysis performs a computation of a maximum gain based upon a desired output divided by the input and the gain of the adjusted speech signal is limited at the output to substantially the maximum gain.

In some aspects, the output is coupled to an audio application in a vehicle. In other aspects, the audio application is selected from the group consisting of a speaker and a microphone. Other examples of audio applications and environments are possible. In this regard, it will be appreciated that although the approaches described herein are often described as being implemented in vehicular environments, they may be applied to any environment and are in no way limited to vehicular environments.

Referring now to FIG. 1, an apparatus 100 configured to control automatic gain control for speech signals includes an interface 102 and a controller 104. The interface 102 includes an input 106 and an output 108 and the input 106 is configured to receive a speech signal 110.

The controller 104 is coupled to the interface 102 and is configured to track at least one electrical value associated with the received speech signal 110. The controller 104 is further configured to determine a dynamic adjustment of the speech signal 110 and the dynamic adjustment is selected at least in part so as to minimize a distortion and minimize an over-amplification of the speech signal 110 based at least in part upon an analysis by the controller 104 of the at least one electrical value. The dynamic adjustment is further selected to obtain a desired output signal characteristic for the modified speech signal 112 to be presented at the output 108. The controller 104 is configured to apply the dynamic adjustment value to the speech signal 110 and present the adjusted speech signal 112 at the output 108 of the interface 102.

In some aspects, the controller 104 is configured to track a power level measured associated with an electrical envelope. In yet other aspects, the controller 104 is configured to track at least one difference between a power level associated with the speech signal 110 and a desired power level, and the dynamic adjustment is effective to maintain the signal at the output signal 112 at substantially the desired power level.

In some examples, the controller 104 computes a maximum gain based upon a desired output divided the input. The gain of the adjusted speech signal 112 is limited at the output to substantially the maximum gain.

In some other aspects, the output 108 is coupled to an audio application 114 in a vehicle. In other aspects, the audio application may be or may utilize a speaker and a microphone as used, for example, in hands-free vehicle applications.

In the above-described approaches, the speech signal 110 is scaled very effectively without depending on the level of input speech (e.g., approximately 40 dB/sec of gain is applied to the speech signal 110 where is necessary without adding any noticeable distortion to speech). In order to realize this, the relative power ratio between the instantaneous speech power level and desired speech power level may be compared.

Based on this ratio, then the AGC scaling rate is determined. In some of these approaches, possible AGC scaling rates may be split into multiple regions and then the actual rate selected from these regions and according to various conditions including the above-mentioned ratio. In one example, the AGC scaling rate is split into three regions: (a) a low AGC scaling rate; (b) a medium AGC scaling rate; and (c) a high AGC scaling rate. In this example, a low AGC scaling rate means that the instantaneous speech power and desired speech power levels are very close therefore, the AGC gain applied to signal vary very slowly from one frame to another (e.g., applying 0.5 dB per second AGC gain). A medium AGC scaling rate means that the instantaneous speech power and desired speech power levels are not that close in which case, AGC gain applied to signal is in the middle range (e.g., applying 7 dB per second AGC gain). A high AGC scaling rate means that the difference between the instantaneous speech power level and desired speech power level are very big in which case, the AGC gain applied to signal should be in the high range (e.g., applying 40 dB per second AGC gain). In these approaches speech levels are normalized as effectively as possible in a short period of time and, hence, providing the desire speech level at the output of HF system.

These approaches also improve the robustness of AGC in extremely noisy environments. More specifically, the above-mentioned AGC algorithms are immune or substantially immune to amplifying noise power and, hence, eliminate or substantially eliminate AGC creep for noise signals under heavy noise environments such as in automobile applications.

For this purpose, speech pauses are detected based on the slow and fast envelope tracking mechanisms. If the speech pauses are detected, then the signal is not scaled and as a result of this the noise power is not amplified. In order to increase the robustness of these approaches, the degree of periodicity measure for speech signals may also be introduced and utilized. Combining both of these methods, the AGC algorithms become very robust in heavy noisy environments and eliminate (or substantially eliminate) the AGC creep problem without amplifying noise while still amplifying speech signals.

Figure 2:
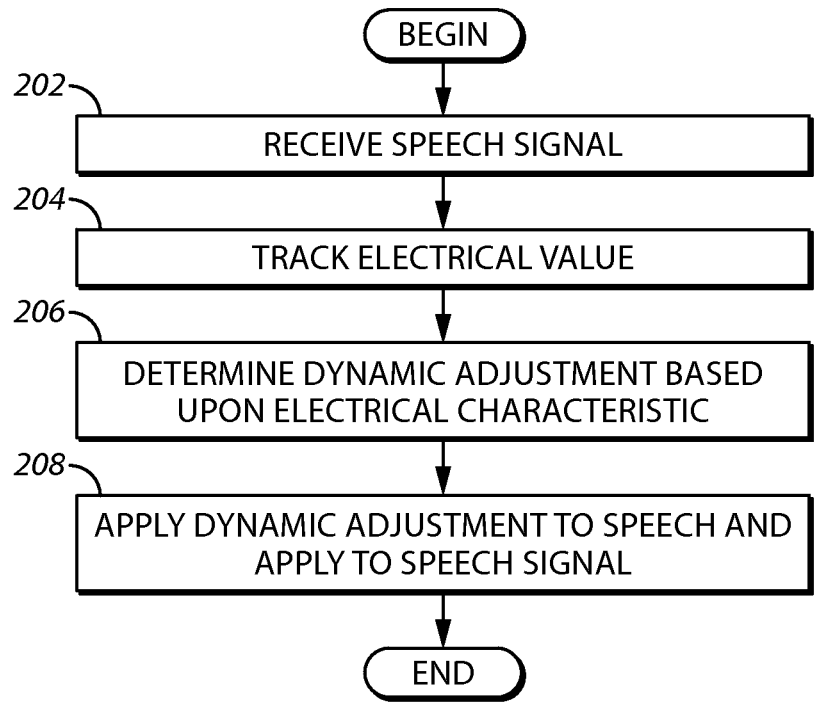
FIG. 2 comprises a flowchart of an approach for providing automatic gain control according to various embodiments of the present invention.

Referring now to FIG. 2, one example of an approach for providing AGC is described. At step 202, a speech signal is received at an input. At step 204, at least one electrical value associated with the received speech signal is tracked. In some aspects, a power level is measured that is associated with an electrical envelope is tracked. In other aspects, a speech pause associated with an electrical envelope is tracked. The tracking may include tracking at least one difference between a power level associated with the speech signal and a desired power level. In this case and to take one example, the dynamic adjustment is effective to maintain the signal at the output at substantially the desired power level.

At step 206, a dynamic adjustment of the speech signal is determined. The dynamic adjustment is selected at least in part so as to minimize a distortion and minimize an over-amplification of the speech signal based at least in part upon an analysis of the at least one electrical value. The dynamic adjustment is further selected to obtain a desired output signal characteristic for the speech signal presented at an output. The analysis may utilize a variety of different calculations. In one aspect, the analysis includes a computation of a maximum gain based upon a desired output divided the input and applying the dynamic adjustment value comprises limiting the gain of the adjusted speech signal at the output to substantially the maximum computed gain.

At step 208, the dynamic adjustment value is applied to the speech signal and the adjusted speech signal is presented at the output. The speech signal may then be transmitted to an audio application in a vehicle. The audio application may be a speaker associated with any application such as hands-free applications in vehicles. Other examples of audio applications are possible.

Figure 3:
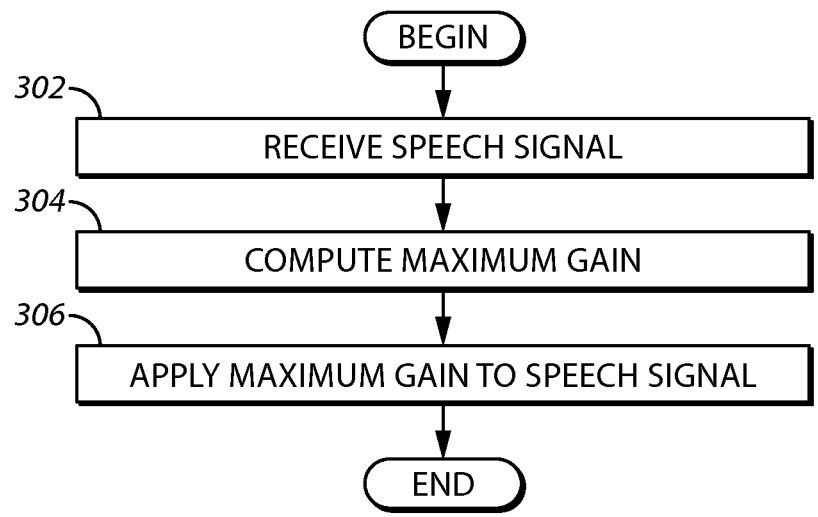
FIG. 3 comprises a flowchart of an approach for providing automatic gain control according to various embodiments of the present invention.

Referring now to FIG. 3, another approach for providing AGC is described. At step 302, a speech signal is received. Based upon at least one characteristic of the speech signal and at least one characteristic of the desired output signal, at step 304, a maximum gain so as to limit over amplification of the received speech signal is determined. In some aspects, the maximum gain comprises a gain that would be effective to saturate the speech signal. In other aspects, the maximum gain comprises a maximum desired output divided by a maximum magnitude of the received speech signal.

For a given input signal I and a desired output signal O, there exists a bounded gain relationship (G), with a predetermined Lower Limit (LL) that will ensure that O does not exceed a given amplitude:

$$LL >= G >= \text{Max Amplitude}_{(O)}/\text{Max Amplitude}_{(I)}$$

Where $G_{(max)}$ is Max Amplitude$_{(O)}$/Max Amplitude$_{(I)}$ and the input and output signals share a common maximum dynamic range.

The choice of LL can be arbitrary or determined by knowledge concerning the limits of I and O. For example, if the amplitude of the output signal cannot exceed that of the input signal, LL is 0 dB (no gain). Thus, the choice of LL reduces under-amplification error.

Since MaxAmplitude$_{(O)}$ is pre-determined, G will vary with MaxAmplitude$_{(I)}$ and will be bounded by LL below. It will only change (and only ever downwards) when a higher-than-previously-seen MaxAmplitude$_{(I)}$ is encountered for a given input/output set.

At step 306, the determined maximum gain is applied to the signal so as to limit over-amplification of the input signal. Since G is now bounded by the above formula, the level of over-amplification the AGC process can apply is limited, reducing its effect. The effect is most pronounced when the signal to be normalized (e.g. speech) is substantially greater in magnitude than the signals that may be misrecognised and normalized erroneously (e.g. noise).

An example application would be the normalization of the signal received from a telephony device where the input is normalized to maximize use of the dynamic range of the output signal. In this case, LL will be 0 dB and G will be limited by the maximum amplitude of the input signal, which may range from full-scale (limiting G to 0 dB) to a lower (normally at most 6 dB, or half) value.

In each case, since the AGC will be operating near $G_{(max)}$ (to normalize speech to full scale), the AGC will be prevented from substantially over-amplifying smaller signals (such as noise) that are misrecognised as speech.

Figure 4:
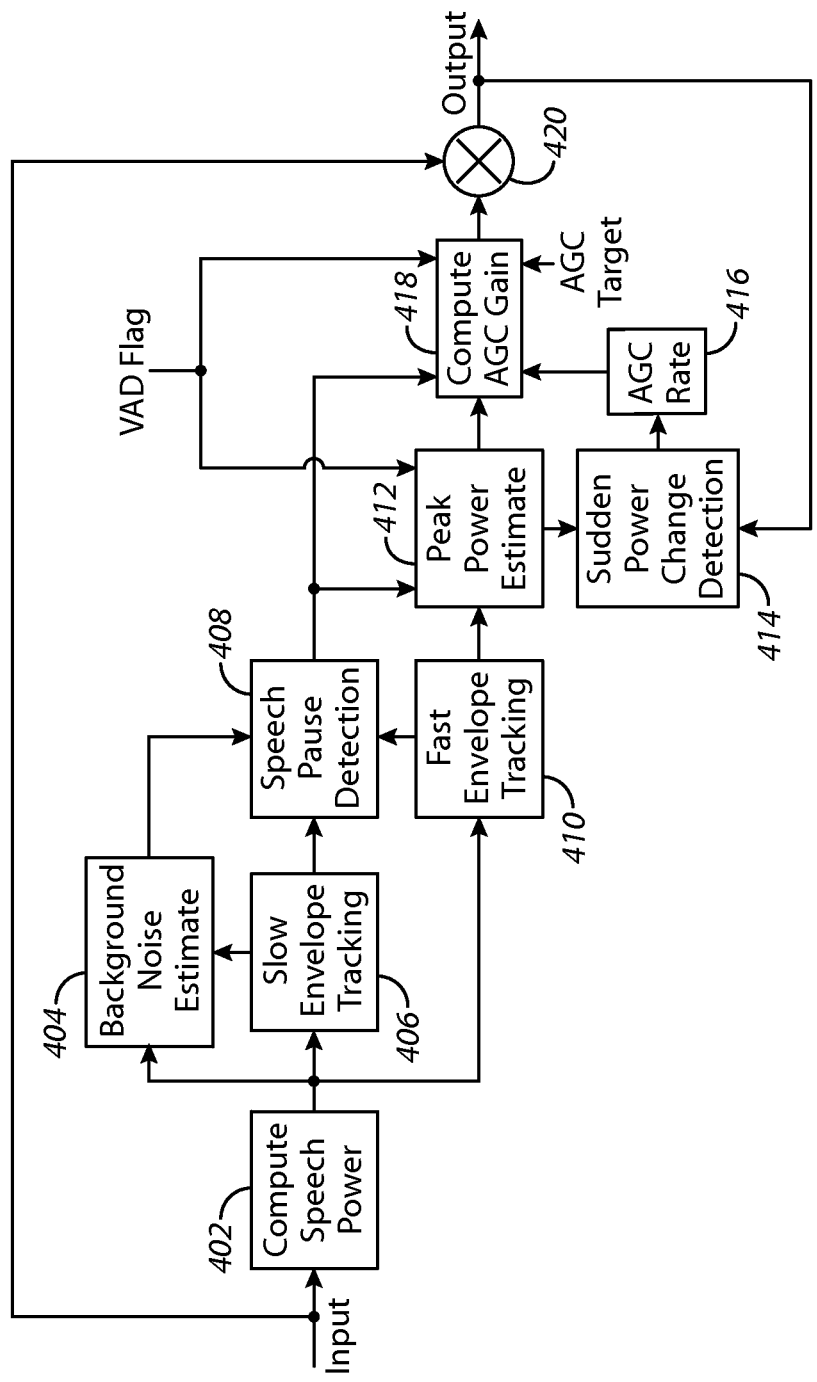
FIG. 4 comprises a flowchart showing an approach for providing automatic gain control according to various embodiments of the present invention.

Referring now to FIG. 4, an example of an approach at AGC is described. This approach describes various modules that can be used to implement the functions described with respect to FIGS. 1 and 2 above. It will be appreciated that these functions may be implemented by any combination of hardware and/or software (e.g., computer instructions stored on computer media). The approach of FIG. 4 utilizes a speech power computation module 402, a background noise estimator, a slow envelope tracking module 406, a speech pause detection module 408, a fast envelope tracking module 410, a peak power estimator 412, a sudden power change detection module 414, an AGC rate module 416, an AGC gain computational module 418, and a summer 420.

The speech power computation module 402 computes power of the speech. The average power, $P_0$ of a speech segment, $s_m(n)$ is computed for the $m^{th}$ speech frame as follows:

$$P_0 = \frac{1}{N}\sum_{n=0}^{N-1} s_m(n)s_m(n) \quad (1)$$

The slow envelope tracking module 406 provides for the slow envelope tracking, first order IIR smoothing of the average power for the input speech signal. The slow envelope tracking, $P_S(m)$ for the $m^{th}$ frame is computed as given in the following equation:

$$P_S(m)=\beta_S(m)P_S(m-1)+(1-\beta_S(m))\sqrt{P_0} \quad (2)$$

The time variant constant, $\beta_S(m)$ for the IIR filter is chosen differentially for rising and falling signal edges as given in the following equation:

$$\beta_S(m) = \begin{cases} \beta_{S,r}; & \sqrt{P_0} > P_S(m-1) \\ \beta_{S,f}; & \text{otherwise} \end{cases} \quad (3)$$

A rising signal edge is followed faster than a falling one as:

$$0 \ll \beta_{S,r} < \beta_{S,f} < 1 \quad (4)$$

The fast envelope tracking module 410 performs the fast envelope tracking, $P_F(m)$ for the $m^{th}$ frame and is computed in the same manner as the slow envelope tracking as given in the following equation:

$$P_F(m) = \beta_F(m)P_F(m-1) + (1-\beta_F(m))\sqrt{P_0} \quad (5)$$

Where $$\beta_F(m) = \begin{cases} \beta_{F,r}; & \sqrt{P_0} > P_F(m-1) \\ \beta_{F,f}; & \text{otherwise} \end{cases} \quad (6)$$

One difference between slow and fast envelope tracking filters, is that the different time varying constants are used which provide the following conditions:

$$\beta_{S,r} > \beta_{F,r}$$

$$\beta_{S,f} > \beta_{F,f} \quad (7)$$

The background noise estimator module 404 provides for estimation of the background noise level, minimum statistics and power smoothing only during speech pauses is used for the AGC algorithm. For estimation of the long term average power of the signal, $P_N(m)$ for the $m^{th}$ frame, first order IIR can be utilized to smooth the instantaneous power of speech signals as given in the following:

$$P_N(m)=\beta_N(m)P_N(m-1)+(1-\beta_N(m))P_0 \quad (8)$$

To detect rising speech signal powers very rapidly, different smoothing constants for rising and falling signal edges are used as given:

$$\beta_N(m) = \begin{cases} \beta_{N,r}; & P_0 > P_N(m-1) \\ \beta_{N,f}; & \text{otherwise} \end{cases} \quad (9)$$

Where $0<\beta_{N,r}<\beta_{N,f}<1$. For estimating the background noise level, $P_{BNE}(m)$ for the $m^{th}$ frame, the minimum of the current average short term power and the output of the background noise level for the previous frame are compared. To avoid freezing at a global minimum, the result of the minimum operator is multiplied by a constant slightly larger than one as:

$$P_{BNE}(m)=\min\{P_N(m),P_{BNE}(m-1)\}(1+\epsilon) \quad (10)$$

Where the constant, $\epsilon$, is a small positive value that controls the maximum speed for increasing the estimated noise level. The quantity:

$$\Delta(\epsilon)=f_s 10 \log_{10}(1+\epsilon) \quad (11)$$

describes the maximum background noise power increase in decibels (dB) per second where $f_s$ is the sampling frequency. Depending on the type of background noise, $\epsilon$ should be chosen such that $\Delta(\epsilon)$ is within the interval 0.5 dB/second and 3 dB/second.

The speech pause detection module 408 compares the outputs of the fast and slow envelope tracking estimators and is the first stage of a simple speech pause detector. At the beginning of speech interval, the output of the fast envelope tracking estimator rises faster than that of the slow one. Due to short term power variations during speech activity on one hand and the choices of the time constants on the other hand, the output signal of the fast envelope tracking estimator is always larger than its slow counterpart. At the end of the voice activity period, the output of the slow envelope tracking estimator does not decrease as rapidly as does that of the fast envelope tracking estimator, and now the output of the slow envelope tracking estimator exceeds that of the fast one.

In order to avoid wrong decisions during speech pauses or voice activity, the simple comparison is enhanced by bounding the output of the slow envelope tracking estimator to a constant, $B_N(m)$. This constant should be chosen a few decibels above ($10 \log_{10}(\alpha)$) the background noise level estimate as described above and given as follows:

$$B_N(m)=\alpha P_{BNE}(m) \quad (12)$$

The threshold for speech pause or speech activity detector, $T(m)$, is then computed as:

$$T(m)=\max\{P_S(m),\sqrt{B_N(m)}\} \quad (13)$$

The speech pauses ($S_{VAD}(m)=0$) or speech activity ($S_{VAD}(m)=1$) is detected as follows:

$$S_{VAD}(m) = \begin{cases} 1; & P_F(m) > T(m) \\ 0; & \text{otherwise} \end{cases} \quad (14)$$

The peak power estimator module 412 estimates the peak power of speech signals. During voice intervals, the peak amplitude level is tracked. This is performed again by first order IIR filtering as:

$$P_P(m) = \begin{cases} \beta_P(m)P_P(m-1) + \\ (1-\beta_P(m))P_F(m); & S_{VAD}(m)=1 \\ P_P(m-1); & \text{Otherwise} \end{cases} \quad (15)$$

The filter is updated only if there is speech activity; otherwise the filter keeps its old output values. The fast envelope tracking estimator is used as an input. In order to avoid an excessive rapid decreases $P_F(m)$ during wrong decision of speech pause detection, a very long time constant for falling signal edges was chosen as:

$$\beta_P(m) = \begin{cases} \beta_{P,r}; & P_F(m) > P_P(m-1) \\ \beta_{P,f}; & \text{otherwise} \end{cases} \quad (16)$$

Where $$0 \ll \beta_{N,r} < \beta_{N,f} < 1 \quad (17)$$

The sudden power change detection module 414 and AGC rate determination module 416 are used to determine the AGC rate that will be applied during AGC gain computation. Additionally, the sudden power change detection pre-determined variety of AGC variables (i.e., peak power estimate, slow envelope tracking, fast envelope tracking, and background noise estimate) and AGC gain are used in order to more effectively eliminate the sudden power change affects in a short period of time.

The AGC gain computation module 418 performs signal scaling. During speech intervals the short term power of the input speech signal is estimated and compared to a desired value. If the speech level exceeds an upper bound, the gain factor, G(m) for the $m^{th}$ frame is decreased—in the other case the gain is increased. In order to avoid fast gain variations during short speech pauses, G(m) is incremented or decremented in very small steps. The gain factors, G(m) is updated only during the periods of speech activity as:

$$G(m) = \begin{cases} \rho G(m-1); & S_{VAD}(m) = 1 \\ G(m-1); & \text{Otherwise} \end{cases} \quad (18)$$

The scaling factor, ρ is computed by comparing the amplified or attenuated (depending on G(m−1)) speech level estimator, $P_P(m)$ with the desired level, $D_L$. If the speech level after scaling with G(m−1) is still small, the gain factor is increased as:

$$\rho = \begin{cases} G_{inc}; & D_L > P_P(m)G(m-1) \\ G_{dec}; & \text{otherwise} \end{cases} \quad (19)$$

Where $$G_{inc} = (1 + \mu) \quad (20)$$
$$G_{dec} = \frac{1}{G_{inc}}$$

Where the constant, μ, is a small positive value that controls the maximum speed for increasing or decreasing the AGC gain in a second. The quantity:

$$\Delta(\mu) = f_s 20 \log_{10}(1+\mu) \quad (21)$$

describes the maximum AGC Gain increase/decrease in decibels (dB) per second where $f_s$ is the sampling frequency. μ should be chosen such that Δ(μ) is to provide the desired AGC gain increase/decrease in decibels (dB) per second. For example, if μ=0.0001, then the Δ(μ)=7 dB per second.

The summer 420 sums the gain from the module 418 and the input signal and this is made available at the output. More specifically, the output speech signal of AGC algorithm for the $m^{th}$ frame, $s_0(m,n)$ is computed by multiplying the input speech signal for the $m^{th}$ frame, $s_m(n)$ with the AGC gain factor, G(m) as:

$$s_0(m,n) = G(m)s_m(n) \quad (22)$$

Figure 5:
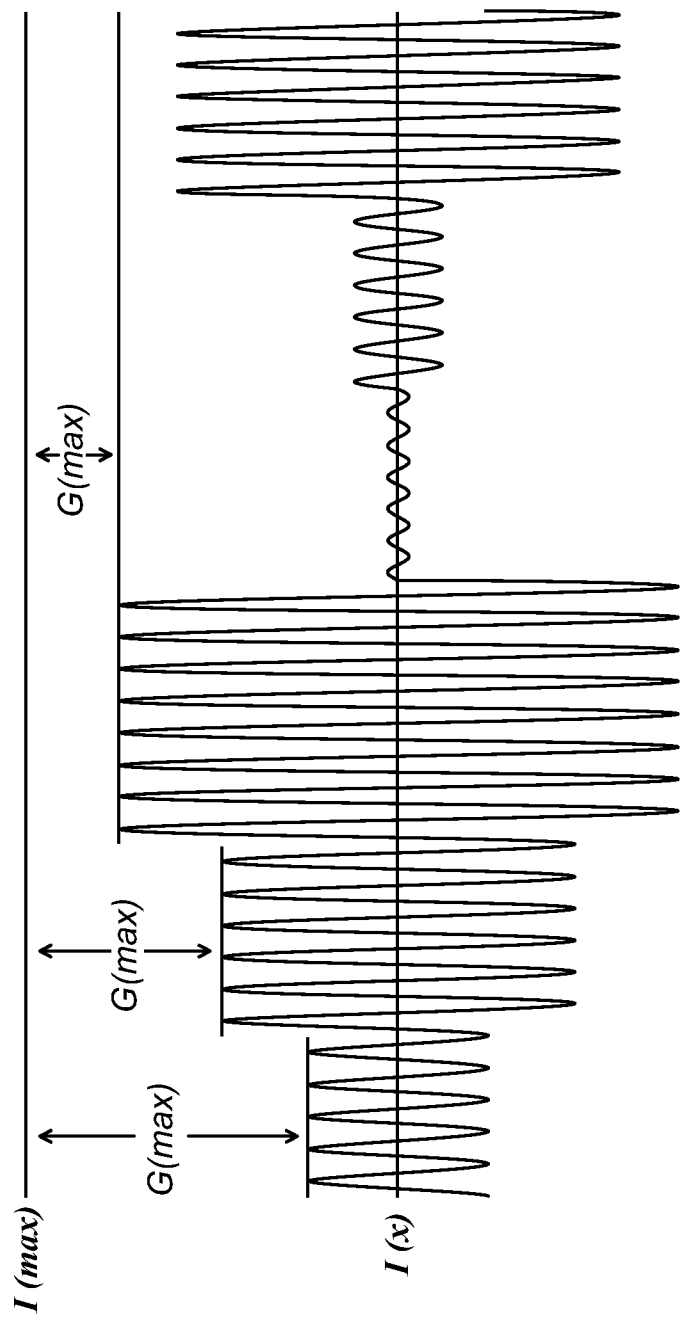
FIG. 5 comprises a graph showing the provision of gain control according to various embodiments of the present invention.

Referring now to FIG. 5, an example graph showing the change in $G_{(max)}$ in response to increasingly larger input signals is described. For each successively higher input sample, $G_{(max)}$ is reduced accordingly. With the upper bound on G shrinking in this fashion, it can be seen that the maximum possible over amplification error (which is often applied to smaller input signals) has been limited by the larger input signals. Thus, over-amplification is prevented and signal quality is improved.

It will be understood that the functions described herein may be implemented by computer instructions stored on a computer media (e.g., in a memory) and executed by a processing device (e.g., a microprocessor, controller, or the like).

It is understood that the implementation of other variations and modifications of the present invention and its various aspects will be apparent to those of ordinary skill in the art and that the present invention is not limited by the specific embodiments described. It is therefore contemplated to cover by the present invention any modifications, variations or equivalents that fall within the spirit and scope of the basic underlying principles disclosed and claimed herein.

What is claimed is:

1. A method for automatic gain control of speech signals, the method comprising:
receiving a speech signal at an input;
computing a power level for a first speech frame that is obtained from the speech signal received at the input;
determining a slow envelope tracking estimate of the computed power level for at least the first speech frame, wherein determining the slow envelope tracking estimate of the computed power level for at least the first speech frame further comprises following a rising signal edge faster than following a falling signal edge;
determining a fast envelope tracking estimate of the computed power level for at least the first speech frame, wherein determining the fast envelope tracking estimate of the computed power level for at least the first speech frame further comprises detecting rising speech signal power levels more rapidly than detecting falling speech signal power levels;
comparing the slow envelope tracking estimate to the fast envelope tracking estimate;
determining a speech frame to be speech that is starting, when the fast envelope tracking estimate increases faster than the slow envelope tracking estimates and determining a speech frame to be speech that is ending, when the fast envelope tracking estimate decreases faster than the slow envelope tracking estimate;
estimating a peak power level for speech in the first speech frame, the peak power level in a frame being determined responsive to a determination of speech being in the first speech frame
adjusting a gain provided to a speech signal during a second speech frame responsive to determining an estimate of the speech peak power level for the first speech frame, the gain adjustment provided to the second speech frame being made while speech is present in the speech signal and approximately equal to a quotient of a desired output power level of the speech signal and the computed power level of the first speech frame;
detecting a speech pause associated with an electrical envelope and not applying the gain adjustment while speech is not present thereby preventing amplifying noise more than amplifying speech when background noise is present and speech is not present; and
presenting an amplified speech signal at the output;
wherein said method is performed by a processor.

2. The method of claim 1 further comprising the step of limiting the gain of the speech signal at the output to a predetermined maximum computed gain.

3. The method of claim 1 further comprising transmitting the amplified speech signal to an audio application in a vehicle.

4. The method of claim 1, further comprising: determining a background noise power estimate during detected speech pauses; and bounding the slow tracking estimate to a constant, which is greater than the background noise power estimate.

5. A method of providing automatic speech gain control to prevent over-amplification of speech signal, the method comprising:
receiving a speech signal at an input;
computing a power level for a first speech frame obtained from the speech signal received at the input;
determining a slow envelope tracking estimate of the computed power level for at least the first speech frame, wherein determining the slow envelope tracking estimate of the computed power level for at least the first speech frame further comprises following a rising signal edge faster than following a falling signal edge;
determining a fast envelope tracking estimate of the computed power level for at least the first speech frame, wherein determining the fast envelope tracking estimate of the computed power level for at least the first speech frame further comprises detecting rising speech signal power levels more rapidly than detecting falling speech signal power levels;
comparing the slow envelope tracking estimate to the fast envelope tracking estimate;
determining speech in a speech frame to be starting, when the fast envelope tracking estimate increases faster than the slow envelope tracking estimate-estimate and
determining speech in a speech frame to be ending, when the fast envelope tracking estimate decreases faster than the slow envelope tracking estimate;
estimating a peak power level for speech in the first speech frame, the peak power level in a frame being determined responsive to a determination of speech being in the first speech frame
adjusting a gain provided to a speech signal and applying the adjusted gain to the speech signal during a second speech frame responsive to determining an estimate of the speech peak power level for the first speech frame, the gain adjustment provided to the second speech frame being approximately equal to a quotient of a desired output power level of the speech signal and the computed power level of the first speech frame;
detecting a speech pause associated with an electrical envelope and not applying the gain adjustment while speech is not present thereby preventing amplifying noise more than amplifying speech when background noise is present and speech is not present;
determining a maximum gain so as to limit over amplification of the received speech signal; and
wherein said method is performed by a processor.

6. The method of claim 5 wherein the maximum gain comprises a gain that would be effective to saturate the speech signal.

7. An apparatus configured to control automatic gain control for speech signals, the apparatus comprising:
an interface with an input and an output, the input being configured to receive a speech signal;
a processor configured to track at least one electrical value associated with the received speech signal, the processor further configured to determine a dynamic adjustment of the speech signal, the dynamic adjustment selected at least in part so as to minimize a distortion and minimize an over-amplification of the speech signal based at least in part upon an analysis by the processor of the at least one electrical value, the dynamic adjustment further selected to obtain a desired output signal characteristic for the speech signal to be presented at the output, the processor configured to apply the dynamic adjustment value to the speech signal, the processor configured to present the adjusted speech signal at the output of the interface, the analysis comprising the determination of a slow envelope tracking rate which comprises following a rising signal edge faster than following a falling signal edge and the determination of a fast envelope tracking rate which comprises detecting rising speech signal power levels more rapidly than detecting falling speech signal power levels, and a comparison of the slow envelope tracking rate to the fast envelope tracking rate and determining speech in a speech frame to be starting, when the fast tracking rate increases faster than the slow tracking rate, and determining speech in a speech frame to be ending when the fast tracking rate decreases faster than the slow tracking rate, the processor configure to detect a speech pause associated with an electrical envelope and to not apply the dynamic adjustment value while speech is not present thereby preventing amplifying the noise more than amplifying speech when background noise is present and speech is not present.

8. The apparatus of claim 7 wherein the processor is configured to track a power level measure associated with an electrical envelope.

9. The apparatus of claim 7 wherein the processor is configured to track at least one difference between a power level associated with the speech signal and a desired power level, and wherein the dynamic adjustment is effective to maintain the signal at the output at approximately the desired power level.

10. The apparatus of claim 7 wherein the analysis comprises a computation of a maximum gain based upon a desired output divided by the input and wherein applying the dynamic adjustment value comprises limiting the gain of the adjusted speech signal at the output to approximately the maximum gain.

11. The apparatus of claim 7 wherein the output is coupled to an audio application in a vehicle.

12. The apparatus of claim 11 wherein the audio application is selected from the group consisting of a speaker and a microphone.

* * * * *